United States Patent
Dokan et al.

(10) Patent No.: US 11,282,701 B2
(45) Date of Patent: Mar. 22, 2022

(54) PLASMA PROCESSING METHOD AND PLASMA PROCESSING APPARATUS

(71) Applicant: TOKYO ELECTRON LIMITED, Tokyo (JP)

(72) Inventors: Takashi Dokan, Miyagi (JP); Shinji Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 46 days.

(21) Appl. No.: 16/599,952

(22) Filed: Oct. 11, 2019

(65) Prior Publication Data
US 2020/0118814 A1    Apr. 16, 2020

(30) Foreign Application Priority Data
Oct. 12, 2018  (JP) .............................. JP2018-193752

(51) Int. Cl.
*H01L 21/02*    (2006.01)
*H01L 21/67*    (2006.01)
*C23C 16/507*   (2006.01)

(52) U.S. Cl.
CPC ...... *H01L 21/02315* (2013.01); *C23C 16/507* (2013.01); *H01L 21/67213* (2013.01)

(58) Field of Classification Search
None
See application file for complete search history.

(56) References Cited

U.S. PATENT DOCUMENTS

2016/0013064 A1* 1/2016 Kim ............... H01J 37/32165
                                                438/714
2018/0047573 A1* 2/2018 Tanaka ............ H01L 21/3065

FOREIGN PATENT DOCUMENTS

JP            06-267895 A     9/1994

* cited by examiner

*Primary Examiner* — Jay C Chang
(74) *Attorney, Agent, or Firm* — Weihrouch Ip (57) ABSTRACT

A plasma processing method includes performing a first plasma processing in a processing chamber in a first period, and performing a second plasma processing in the chamber in a second period which is after the first period or following the first period. The first plasma processing and the second plasma processing are performed in a state where a substrate is disposed on a substrate support stage provided in the processing chamber. A sequence including the first plasma processing and the second plasma processing is performed a plurality of times.

26 Claims, 9 Drawing Sheets

PLASMA PROCESSING METHOD AND PLASMA PROCESSING APPARATUS

CROSS-REFERENCE TO RELATED APPLICATIONS

This application is based on and claims priority from Japanese Patent Application No. 2018-193752 filed on Oct. 12, 2018 with the Japan Patent Office, the disclosure of which is incorporated herein in its entirety by reference.

TECHNICAL FIELD

An exemplary embodiment of the present disclosure relates to a plasma processing method and a plasma processing apparatus.

BACKGROUND

In manufacturing electronic devices, a plasma processing is performed using a plasma processing apparatus. The plasma processing apparatus includes a chamber and a substrate support stage. The substrate support stage includes a lower electrode and is provided in the chamber. In the plasma processing, a radio-frequency power is supplied to excite a gas in the chamber, and plasma is generated from the gas.

While performing the plasma processing, another radio-frequency power may be supplied to the lower electrode. Another radio-frequency power has a frequency lower than the frequency of the radio-frequency power for plasma generation. That is, another radio-frequency power is a bias radio-frequency power. In general, the bias radio-frequency power is used to adjust the energy of ions that collide with a substrate disposed on the substrate support stage. The energy of the ions that collide with the substrate becomes high when the bias radio-frequency power having a high power level is supplied to the lower electrode. Meanwhile, the energy of the ions that collide with the substrate becomes low when the bias radio-frequency power having a low power level is supplied to the lower electrode.

A plasma processing for etching a silicon nitride film is disclosed in Japanese Patent Laid-Open Publication No. 06-267895. In the technology disclosed in Japanese Patent Laid-Open Publication No. 06-267895, the power level of the bias radio-frequency power is set to a high level during the etching of the silicon nitride film. Further, in the technology disclosed in Japanese Patent Laid-Open Publication No. 06-267895, when the silicon nitride film and the silicon oxide film are both exposed by the etching of the silicon nitride film, the power level of the bias radio-frequency power is alternately switched between a high level and a low level.

SUMMARY

In an exemplary embodiment, a plasma processing method is provided. The plasma processing method includes a step of performing a first plasma processing in a chamber in a first period, and a step of performing a second plasma processing in the chamber in a second period. The second period is a period which is after the first period or following the first period. The step of performing the first plasma processing and the step of performing the second plasma processing are performed in a state where a substrate is placed on a substrate support stage provided in the chamber. In the plasma processing method, a sequence including the step of performing the first plasma processing and the step of performing the second plasma processing is performed a plurality of times. A first radio-frequency power is supplied to a lower electrode of the substrate support stage within the second period. The first radio-frequency power has a first frequency. The supply of the first radio-frequency power to the lower electrode is stopped within the first period. A second radio-frequency power for plasma generation is supplied as a pulsed radio-frequency power in each period of the first radio-frequency power within the second period. The second radio-frequency power has a second frequency higher than the first frequency. The second radio-frequency power is continuously supplied or is supplied as a pulsed radio-frequency power within the first period.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various exemplary embodiments will be described.

In an exemplary embodiment, a plasma processing method is provided. The plasma processing method includes a step of performing a first plasma processing in a chamber in a first period, and a step of performing a second plasma processing in the chamber in a second period. The second period is a period which is after the first period or following the first period. The step of performing the first plasma processing and the step of performing the second plasma processing are performed in a state where a substrate is placed on a substrate support stage provided in the chamber. In the plasma processing method, a sequence including the step of performing the first plasma processing and the step of performing the second plasma processing is performed a plurality of times. A first radio-frequency power is supplied to a lower electrode of the substrate support stage within the second period. The first radio-frequency power has a first frequency. The supply of the first radio-frequency power to the lower electrode is stopped within the first period. A second radio-frequency power for plasma generation is supplied as a pulsed radio-frequency power in each period of the first radio-frequency power within the second period. The second radio-frequency power has a second frequency higher than the first frequency. The second radio-frequency power is continuously supplied or is supplied as a pulsed radio-frequency power within the first period.

In the exemplary embodiment, since the first radio-frequency power, that is, a bias radio-frequency power is not supplied to the lower electrode in the first period, chemical species generated in the chamber is deposited on the substrate placed on the substrate support stage. Since the first radio-frequency power is supplied to the lower electrode in the second period, the film of the substrate is etched by ions generated in the chamber. Further, a period in which the second radio-frequency power for plasma generation is supplied as a pulsed radio-frequency power in each period of the first radio-frequency power within the second period is set, whereby the energy of the ions used for etching may be set.

In the exemplary embodiment, the second radio-frequency power may be supplied as the pulsed radio-frequency power in a period in which the first radio-frequency power output from a first radio-frequency power supply in each period of the first radio-frequency power within the second period has a negative potential. In the embodiment, the energy of the ions during the etching of the film may be set to a relatively high energy.

In the exemplary embodiment, the second radio-frequency power may be supplied as the pulsed radio-frequency power in a period in which the first radio-frequency power output from a first radio-frequency power supply in each period of the first radio-frequency power within the second period has a positive potential. In the embodiment, the energy of the ions during the etching of the film may be set to a relatively low energy.

In the exemplary embodiment, the second radio-frequency power may be supplied as the pulsed radio-frequency power within the first period, in a same cycle as a cycle in which the pulsed radio-frequency power is supplied within the second period.

In the exemplary embodiment, the plasma processing method further includes a step of exhausting the chamber in a state where the supply of the first radio-frequency power and the second radio-frequency power is stopped. The step of exhausting the chamber may be performed after performing the step of performing the second plasma processing in the sequence.

In the exemplary embodiment, the processing gas used for the first plasma processing and the processing gas used for the second plasma processing may be the same. In the exemplary embodiment, the processing gas used for the first plasma processing and the processing gas used for the second plasma processing may be different from each other.

In another exemplary embodiment, a plasma processing apparatus is provided. The plasma processing apparatus includes a chamber, a substrate support stage, a first radio-frequency power supply, a second radio-frequency power supply, and a controller. The substrate support stage includes a lower electrode and is provided in the chamber. The first radio-frequency power supply is configured to supply the first radio-frequency power having a first frequency to the lower electrode. The second radio-frequency power supply is configured to supply the second radio-frequency power having a second frequency higher than the first frequency to generate plasma. The controller is configured to control the first radio-frequency power supply and the second radio-frequency power supply. The controller repeatedly performs a control sequence. The control sequence includes a first control and a second control. The first control is performed to perform the first plasma processing in the chamber in the first period. The second control is performed to perform the second plasma processing in the chamber in the second period. The second period is a period which is after the first period or following the first period. The first control includes controlling the first radio-frequency power supply to stop the supply of the first radio-frequency power to the lower electrode in the first period. The first control further includes controlling the second radio-frequency power supply to supply the second radio-frequency power continuously or as a pulsed radio-frequency power within the first period. The second control includes controlling the first radio-frequency power supply to supply the first radio-frequency power to the lower electrode in the second period. The second control further includes controlling the second radio-frequency power supply to supply the second radio-frequency power as a pulsed radio-frequency power in each period of the first radio-frequency power within the second period.

Hereinafter, various exemplary embodiments will be described in detail with reference to the drawings. Meanwhile, in the respective drawings, the same or corresponding parts will be denoted by the same symbols.

Figure 1:
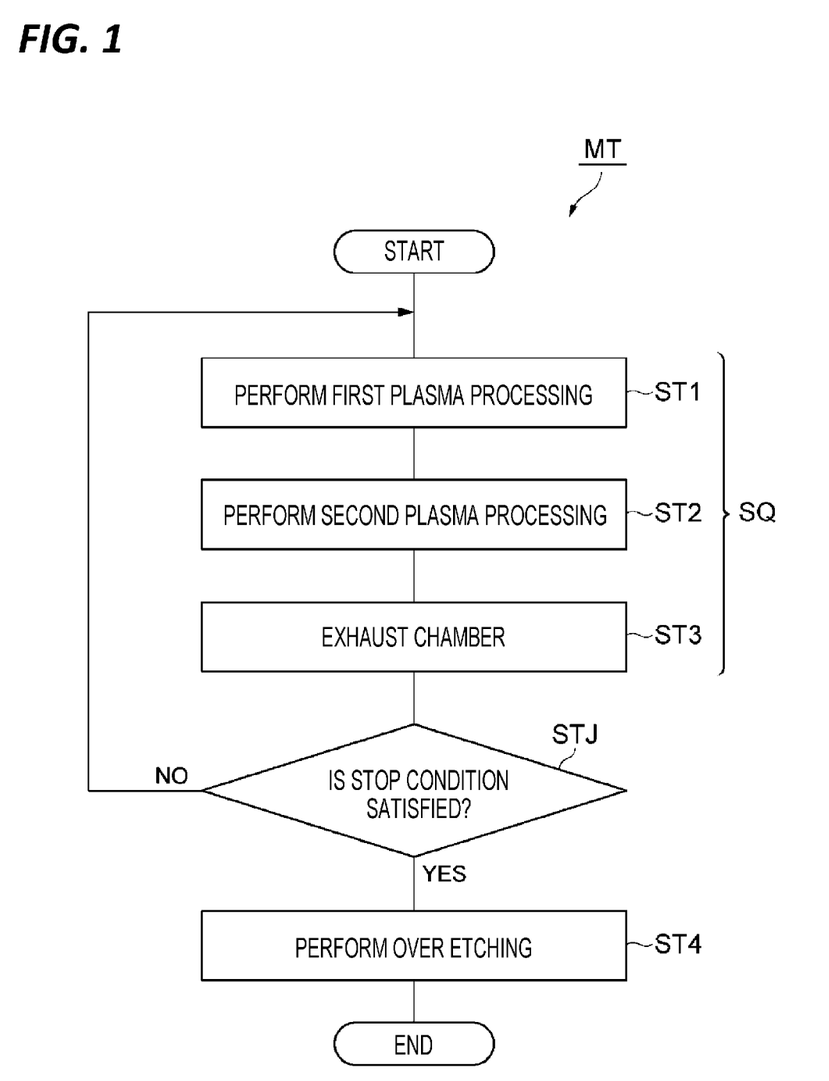
FIG. 1 is a flowchart illustrating a plasma processing method according to an exemplary embodiment.
Figure 2:
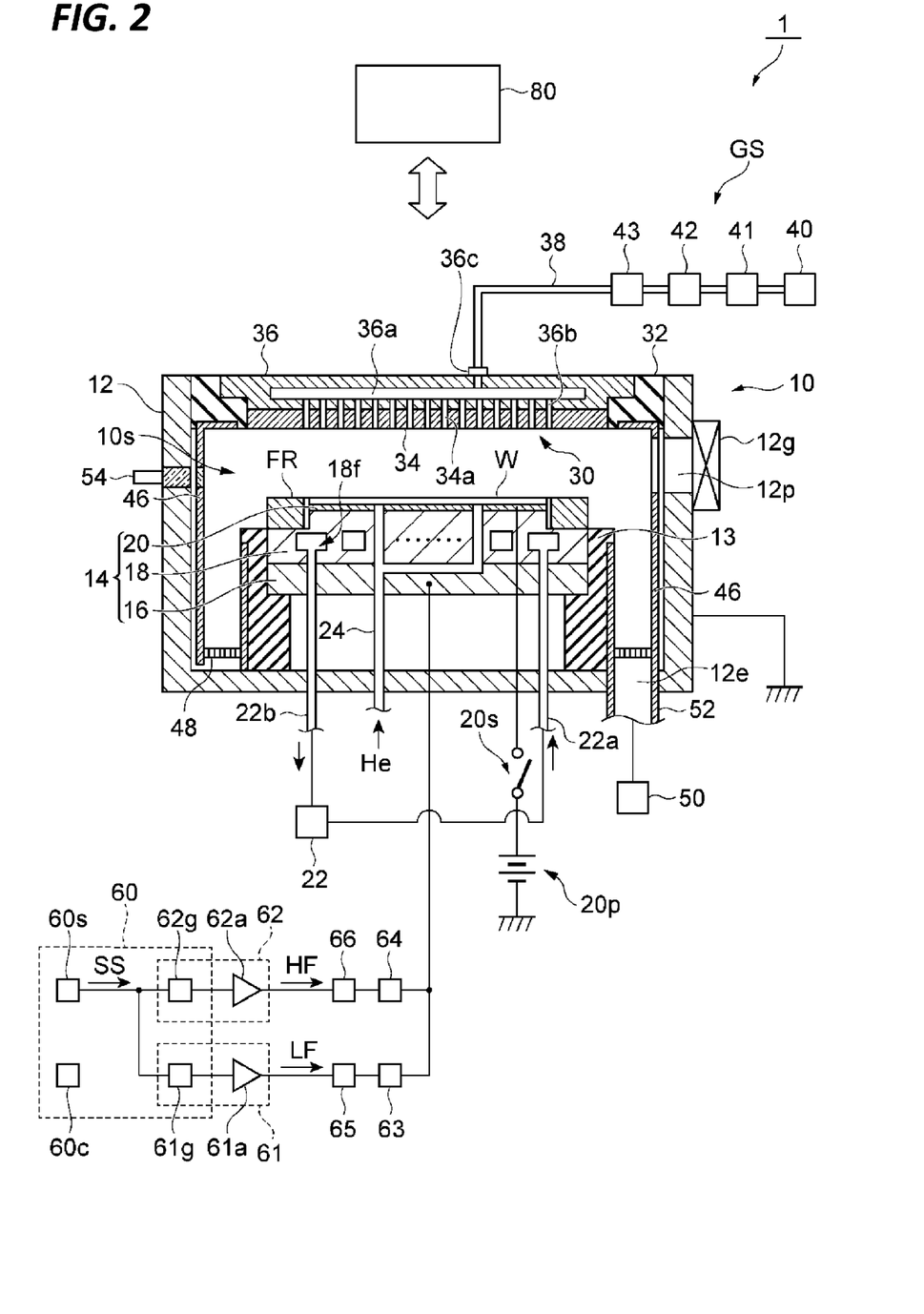
FIG. 2 is a schematic view illustrating a plasma processing apparatus according to an exemplary embodiment.

FIG. 1 is a flowchart illustrating a plasma processing method according to an exemplary embodiment. The plasma processing method (hereinafter, referred to as a "method MT") illustrated in FIG. 1 is performed using a plasma processing apparatus. FIG. 2 is a schematic view illustrating a plasma processing apparatus according to an exemplary embodiment. The plasma processing apparatus illustrated in FIG. 2 may be used to perform the plasma processing method according to various embodiments of the present disclosure.

A plasma processing apparatus 1 illustrated in FIG. 2 is a capacitively coupled plasma processing apparatus. The plasma processing apparatus 1 includes a chamber 10. The chamber 10 provided an internal space 10s therein.

The chamber 10 includes a chamber body 12. The chamber body 12 has a substantially cylindrical shape. The internal space 10s is provided inside the chamber body 12. The chamber body 12 is made of, for example, aluminum. A film having corrosion resistance is provided on an inner wall surface of the chamber body 12. The film having corrosion resistance may be a film made of a ceramic such as aluminum oxide or yttrium oxide.

A passage 12p is formed at a side wall of the chamber body 12. A substrate W passes through the passage 12p when being transferred between the internal space 10s and the outside of the chamber 10. The passage 12p may be opened/closed by a gate valve 12g. The gate valve 12g is provided along the side wall of the chamber body 12.

A support 13 is provided on the bottom portion of the chamber body 12. The support 13 is made of an insulating material. The support 13 has a substantially cylindrical shape. The support 13 extends upward from the bottom portion of the chamber body 12 in the internal space 10s. The support 13 supports a substrate support stage, that is, a support stage 14. The support state 14 is provided in the internal space 10s. The support stage 14 is configured to support the substrate W in the chamber 10, that is, in the internal space 10s.

The support stage 14 includes a lower electrode 18 and an electrostatic chuck 20. The support stage 14 may further include an electrode plate 16. The electrode plate 16 is made of, for example a conductor such as aluminum, and has a substantially disc shape. The lower electrode 18 is provided on the electrode plate 16. The lower electrode 18 is made of, for example a conductor such as aluminum, and has a substantially disc shape. The lower electrode 18 is electrically connected to the electrode plate 16.

The electrostatic chuck 20 is provided on the lower electrode 18. The substrate W is disposed on the upper surface of the electrostatic chuck 20. The electrostatic chuck 20 includes a body and an electrode. The body of the electrostatic chuck 20 has a substantially disc shape, and is made of a dielectric. The electrode of the electrostatic chuck 20 is a film-like electrode, and is provided in the body of the electrostatic chuck 20. The electrode of the electrostatic chuck 20 is connected to a DC power source 20p through a switch 20s. When a voltage from the DC power source 20p is applied to the electrode of the electrostatic chuck 20, an electrostatic attractive force is generated between the electrostatic chuck 20 and the substrate W. Due to the generated electrostatic attractive force, the substrate W is attracted to the electrostatic chuck 20 and held by the electrostatic chuck 20.

A focus ring FR is disposed on a periphery of the lower electrode 18 to surround an edge of the substrate W. The focus ring FR is provided to improve the in-plane uniformity of the plasma processing on the substrate W. The focus ring FR may be made of silicon, silicon carbide, or quartz, but not limited thereto.

A flow path 18f is provided in the lower electrode 18. A heat exchange medium (e.g., a refrigerant) is supplied to the flow path 18f through a pipe 22a from a chiller unit 22 provided outside the chamber 10. The heat exchange medium supplied to the flow path 18f returns to the chiller unit 22 through a pipe 22b. In the plasma processing apparatus 1, the temperature of the substrate W placed on the electrostatic chuck 20 is adjusted by the heat exchange between the heat exchange medium and the lower electrode 18.

A gas supply line 24 is provided in the plasma processing apparatus 1. The gas supply line 24 supplies a heat transfer gas (e.g., helium (He) gas) from a heat transfer gas supply mechanism to a gap between the upper surface of the electrostatic chuck 20 and the rear surface of the substrate W.

The plasma processing apparatus 1 further includes an upper electrode 30. The upper electrode 30 is provided above the support stage 14. The upper electrode 30 is supported in the upper portion of the chamber body 12 through a member 32. The member 32 is made of an insulating material. The upper electrode 30 and the member 32 close the upper opening of the chamber body 12.

The upper electrode 30 may include a top plate 34 and a support body 36. The lower surface of the top plate 34 is the lower surface on the internal space 10s side, and defines the internal space 10s. The top plate 34 may be made of a low resistance conductor or a semiconductor having low Joule heat. A plurality of gas discharge holes 34a are formed in the top plate 34. The plurality of gas discharge holes 34a penetrate the top plate 34 in the plate thickness direction.

The support body 36 detachably supports the electrode plate 34. The support body 36 is made of a conductive material such as aluminum. A gas diffusion chamber 36a is provided inside the support body 36. A plurality of gas holes 36b are formed in the support body 36. The plurality of gas holes 36b extend downward from the gas diffusion chamber 36a. The plurality of gas holes 36b communicate with the plurality of gas discharge holes 34a, respectively. A gas introducing port 36c is formed in the support body 36. The gas introducing port 36c is connected to the gas diffusion chamber 36a. A gas supply pipe 38 is connected to the gas introducing port 36c.

The plasma processing apparatus 1 further includes a gas supply GS. The gas supply GS includes a gas source group 40, a valve group 41, a flow rate controller group 42, and a valve group 43. The gas source group 40 is connected to the gas supply pipe 38 through the valve group 41, the flow rate controller group 42, and the valve group 43. The gas source group 40 includes a plurality of gas sources. The plurality of gas sources include sources of a plurality of gases used in each of the various embodiments. Each of the valve group 41 and the valve group 43 includes a plurality of opening/closing valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through the opening/closing valves corresponding to the valve group 41, the flow rate controllers corresponding to the flow rate controller group 42, and the opening/closing valves corresponding to the valve group 43.

In the plasma processing apparatus 1, a shield 46 is provided detachably along the inner wall of the chamber body 12. The shield 46 is provided in the outer periphery of the support 13 as well. The shield 46 prevents etching byproducts from being adhered to the chamber body 12. The shield 46 is formed by, for example, forming a film having corrosion resistance on the surface of a member made of aluminum. The film having corrosion resistance may be a film made of a ceramic such as yttrium oxide.

A baffle plate 48 is provided between the support 13 and the sidewall of the chamber body 12. The baffle plate 48 is formed by, for example, forming a film having corrosion resistance on the surface of a member made of aluminum. The film having corrosion resistance may be a film made of a ceramic such as yttrium oxide. A plurality of through-holes are formed in the baffle plate 48. An exhaust port 12e is provided at the lower side of the baffle plate 48, and at the bottom portion of the chamber body 12 as well. An exhaust device 50 is connected to the exhaust port 12e through an exhaust pipe 52. The exhaust device 50 includes a vacuum pump such as a pressure adjusting valve and a turbo molecular pump.

The plasma processing apparatus 1 may further include a light emission analyzer 54. The light emission analyzer 54 is provided outside of the chamber 10. The light emission analyzer 54 receives light from plasma through an optically transparent window member formed in the chamber 10. The light emission analyzer 54 acquires light emission intensity of one or more wavelengths of the plasma. A controller 80 (to be described later) may terminate the steps based on the light emission intensity acquired by the light emission analyzer 54.

The plasma processing apparatus 1 further includes a first radio-frequency power supply 61. The first radio-frequency power supply 61 is configured to output a first radio-frequency power LF. The first radio-frequency power LF has a frequency suitable for mainly drawing ions into the substrate W. A first frequency which is a basic frequency of the first radio-frequency power LF is a frequency, for example, in a range of 50 kHz to 13.56 MHz.

The first radio-frequency power supply 61 is connected to the lower electrode 18 through a matcher 63. The matcher 63 includes a matching circuit. The matching circuit of the matcher 63 is configured to match the impedance on the load side (lower electrode side) of the first radio-frequency power supply 61 with the output impedance of the first radio-frequency power supply 61. In the embodiment, the plasma processing apparatus 1 may further include a directional coupler 65. The directional coupler 65 is provided between the first radio-frequency power supply 61 and the matcher 63.

The plasma processing apparatus 1 further includes a second radio-frequency power supply 62. The second radio-frequency power supply 62 is configured to output a second radio-frequency power HF to generate plasma from a gas in the chamber 10. A second frequency which is a basic frequency of the second radio-frequency power HF is higher than the first frequency. The second frequency is a frequency, for example, in a range of 27 MHz to 300 MHz.

The second radio-frequency power supply 62 is connected to the lower electrode 18 through a matcher 64. The matcher 64 includes a matching circuit. The matching circuit of the matcher 64 is configured to match the impedance on the load side (lower electrode side) of the second radio-frequency power supply 62 with the output impedance of the second radio-frequency power supply 62. The plasma processing apparatus 1 may further include a directional coupler 66. The directional coupler 66 is provided between the second radio-frequency power supply 62 and the matcher 64. In another embodiment, the second radio-frequency power supply 62 may be electrically connected to the upper electrode 30 through the matcher 64.

The plasma processing apparatus 1 may further include the controller 80. The controller 80 may be a computer including, for example, a processor, a storage unit such as a memory, an input device, a display device, and a signal input/output interface. The controller 80 controls each part of the plasma processing apparatus 1. In the controller 80, an operator may execute an input operation of a command using the input device to manage the plasma processing apparatus 1. Further, in the controller 80, the operation status of the plasma processing apparatus 1 may be visualized and displayed by the display device. Further, a control program and a recipe data are stored in the storage unit of the controller 80. The control program is executed by the processor of the controller 80, in order to execute various processes in the plasma processing apparatus 1. The processor of the controller 80 executes the control program and controls each part of the plasma processing apparatus 1 according to the recipe data, whereby each plasma processing method of various embodiments is executed by the plasma processing apparatus 1.

The first radio-frequency power supply 61 is configured to stop the output of the first radio-frequency power LF in a period designated by the controller 80. Further, the first radio-frequency power supply 61 is configured to continuously output the first radio-frequency power LF (continuous radio-frequency power) in another period designated by the controller 80.

In the embodiment, the first radio-frequency power supply 61 includes a signal generator 61g and an amplifier 61a. The signal generator 61g is configured to generate a first radio-frequency signal. The first radio-frequency signal has a first frequency. The signal generator 61g is configured to stop the output of the first radio-frequency signal in a period designated by the controller 80. The signal generator 61g is configured to continuously output the first radio-frequency signal in another period designated by the controller 80. The signal generator 61g is configured to receive a synchronization signal SS from a synchronization signal generator 60s. The synchronization signal SS includes a synchronization pulse. The synchronization pulse is output in a cycle defined by the first frequency. The signal generator 61g generates the first radio-frequency signal to be synchronized with the synchronization pulse included in the synchronization signal SS. The input of the amplifier 61a is connected to the output of the signal generator 61g. The amplifier 61a amplifies the first radio-frequency signal to generate the first radio-frequency power LF.

The second radio-frequency power supply 62 is configured to continuously output the second radio-frequency power HF in each period of the first radio-frequency power LF, according to the control signal from the controller 80 and the synchronization signal SS from the synchronization signal generator 60s. Further, the second radio-frequency power supply 62 is configured to output the second radio-frequency power HF as a pulsed radio-frequency power in each period of the first radio-frequency power LF, according to the control signal from the controller 80 and the synchronization signal SS from the synchronization signal generator 60s. Each cycle of the first radio-frequency power LF is specified from the synchronization signal SS from the synchronization signal generator 60s. The pulsed radio-frequency power is a radio-frequency power whose power level is increased in a specific period in a certain period. For example, the power level of the pulsed radio-frequency power is larger than 0 in a specific period in a certain period, and is 0 in periods before and after the specific period. The period in which the second radio-frequency power HF is output as a pulsed radio-frequency power in each period of the first radio-frequency power LF is designated by the control signal from the controller 80.

In the embodiment, the second radio-frequency power supply 62 includes a signal generator 62g and an amplifier 62a. The signal generator 62g is configured to generate a second radio-frequency signal. The second radio-frequency signal has a second frequency. The signal generator 62g is configured to receive the synchronization signal SS from the synchronization signal generator 60s. The signal generator 62g outputs the second radio-frequency signal as a continuous wave when the second radio-frequency power HF is output as a continuous wave, according to the control signal from the controller 80. The signal generator 62g outputs the second radio-frequency signal as a pulsed radio-frequency signal when the second radio-frequency power HF is output as a pulsed radio-frequency power, according to the control signal from the controller 80. The signal generator 62g outputs the second radio-frequency signal at a timing designated by the controller 80 based on a time specified by the synchronization pulse. The input of the amplifier 62a is connected to the output of the signal generator 62g. The amplifier 62a amplifies the radio-frequency signal from the signal generator 62g to generate the second radio-frequency power HF.

The synchronization signal generator 60s, the signal generator 61g, and the signal generator 62g described above may be provided by one signal generator 60. The signal generator 60 may further include a controller 60c. The controller 60c is configured to control the synchronization signal generator 60s, the signal generator 61g, and the signal generator 62g according to the control signal from the controller 80.

Figure 3A:
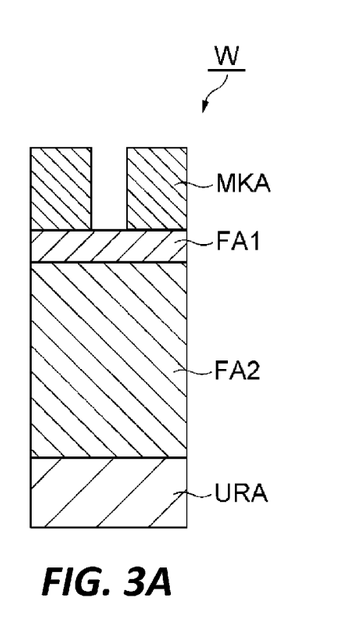
FIG. 3A is a partial cross-sectional view of a substrate of an example to which a method MT illustrated in FIG. 1 may be applied.
Figure 3B:
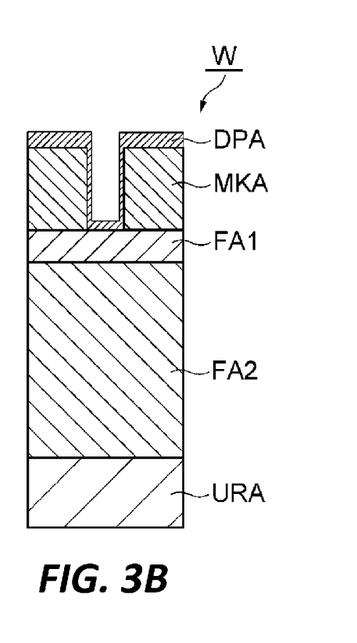
FIG. 3B is a partial cross-sectional view of the substrate of the example in a state after step ST1 of the method MT is performed.
Figure 3C:
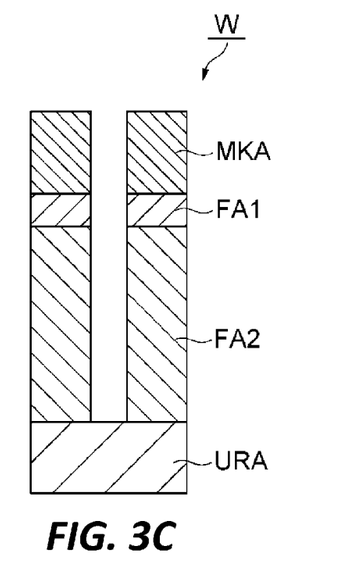
FIG. 3C is a partial cross-sectional view of the substrate of the example in a state after a sequence SQ of the method MT is performed.
Figure 3D:
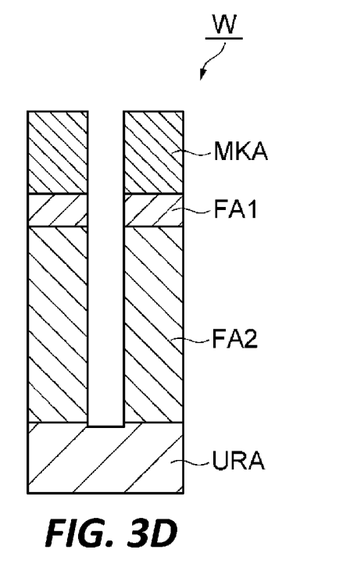
FIG. 3D is a partial cross-sectional view of the substrate of the example in a state after step ST4 of the method MT is performed.

Hereinafter, a plasma processing method according to various embodiments will be described in detail by taking the case where the plasma processing apparatus 1 is used as an example. In the following description, FIGS. 3A to 3D and FIGS. 4 to 7 are referred to together with FIG. 1. FIG. 3A is a partial cross-sectional view of a substrate of an example to which the method MT illustrated in FIG. 1 may be applied. FIG. 3B is a partial cross-sectional view of the substrate of the example in a state after performing step ST1 of the method MT, FIG. 3C is a partial cross-sectional view of the substrate of the example in a state after performing a sequence SQ of the method MT, and FIG. 3D is a partial cross-sectional view of the substrate of the example in a state after performing step ST4 of the method MT. Each of FIGS. 4 to 7 is a timing chart of an example according to the plasma processing method illustrated in FIG. 1. In the timing chart illustrated in each of FIGS. 4 to 7, the horizontal axis represents time. In the timing chart illustrated in each of FIGS. 4 to 7, the synchronization signal SS, the first radio-frequency power LF, and the second radio-frequency power HF are presented on the vertical axis.

As illustrated in FIG. 3A, the substrate W of the example to which the method MT may be applied includes an underlying region URA, a film FA1, a film FA2, and a mask MKA. The underlying region URA is made of, for example, silicon. The film FA2 is provided on the underlying region URA. The underlying region URA is made of, for example, silicon oxide. The film FA1 is provided on the film FA2. The film FA1 is, for example, an anti-reflective film containing silicon. The mask MKA is provided on the film FA1. The mask MKA is, for example, a photoresist mask. The mask MKA is patterned to partially expose the film FA1. That is, the mask MKA provides an opening.

The method MT includes step ST1 and step ST2. Step ST1 and step ST2 are performed in a state where the substrate W is disposed in the chamber 10. In the chamber 10, the substrate W is placed on the support stage 14. Step ST1 is performed in a first period $P_1$. The time length of the first period $P_1$ may be m times the time length of one cycle of the first radio-frequency power LF. "m" is an integer of 1 or more. In step ST1, a first plasma processing is performed in the chamber 10. Step ST2 is performed in a second period $P_2$. The second period $P_2$ is a period which is after the first period $P_1$ or following the first period $P_1$. In step ST2, a second plasma processing is performed in the chamber 10. The time length of the second period $P_2$ may be n times the time length of one cycle of the first radio-frequency power LF. "n" is an integer of 1 or more.

In order to perform the method MT, the controller 80 repeatedly performs a control sequence including a first control and a second control. The first control is a control for performing step ST1. The second control is a control for performing step ST2.

In step ST1, a processing gas is supplied into the chamber 10. The processing gas (hereinafter, may be referred to as a "first processing gas") used in step ST1 may contain a fluorocarbon gas such as $C_4F_8$ gas, but not limited thereto. The first processing gas may further contain an oxygen-containing gas such as $O_2$ gas and/or a rare gas such as argon gas.

In another example, the first processing gas may contain a hydrofluorocarbon gas and a fluorocarbon gas. The hydrofluorocarbon gas is, for example, $CH_3F$ gas. The fluorocarbon gas is, for example, $C_4F_8$ gas. The first processing gas may further contain a rare gas such as argon gas.

In step ST1, the gas supply GS is controlled by the controller 80 to supply the first processing gas. In step ST1, the exhaust device 50 is controlled by the controller 80 to set the pressure in the chamber 10 to a designated pressure. The pressure in the chamber 10 is set to a pressure, for example, in a range of several mTorr to 1,000 mTorr.

In the first period $P_1$ in which step ST1 is performed, the supply of the first radio-frequency power LF to the lower electrode 18 is stopped. In the first period $P_1$ in which step ST1 is performed, the first radio-frequency power supply 61 is controlled by the controller 80 to stop the supply of the first radio-frequency power LF to the lower electrode 18.

Figure 4:
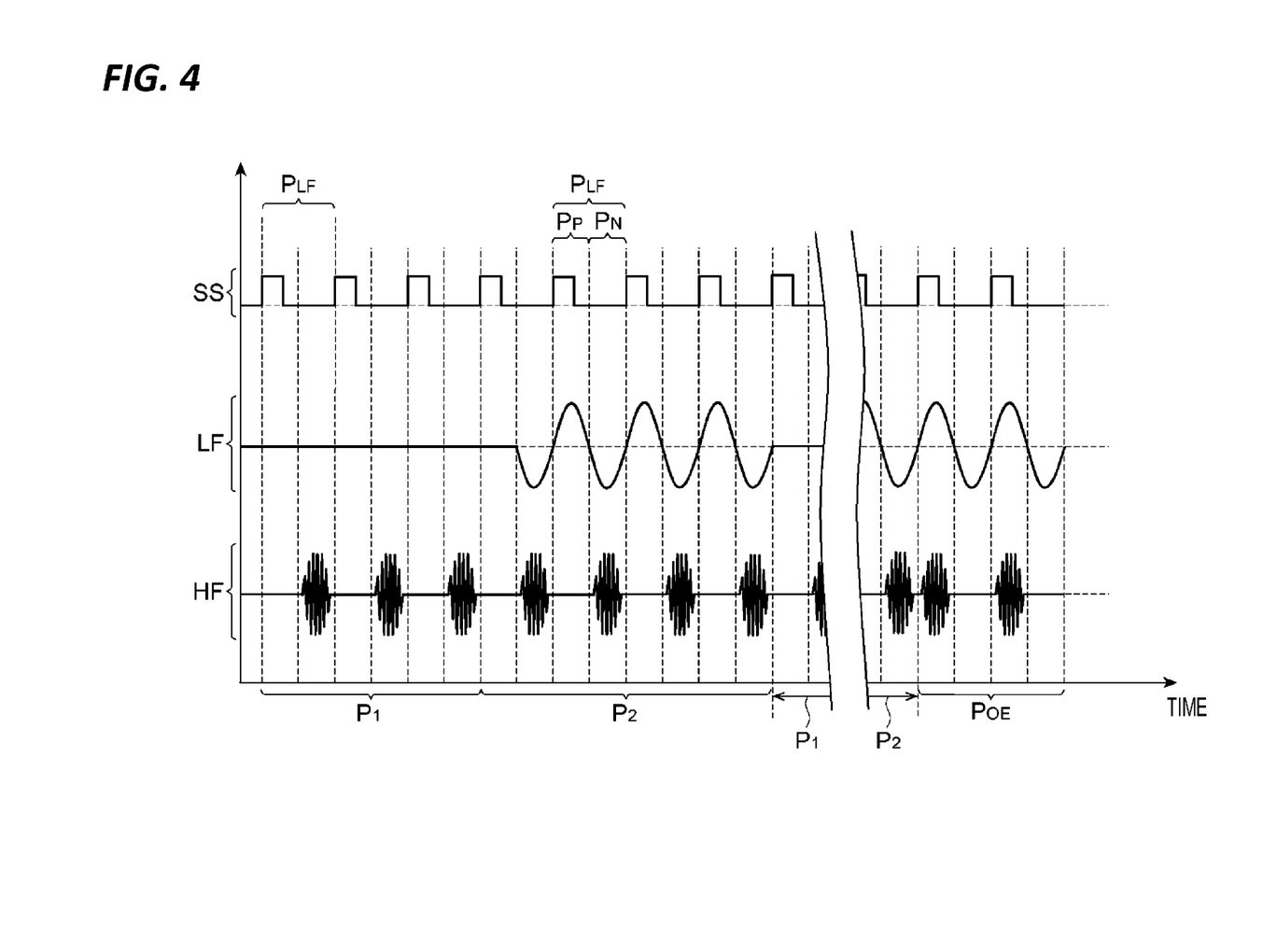
FIG. 4 is a timing chart of an example according to the plasma processing method illustrated in FIG. 1.
Figure 5:
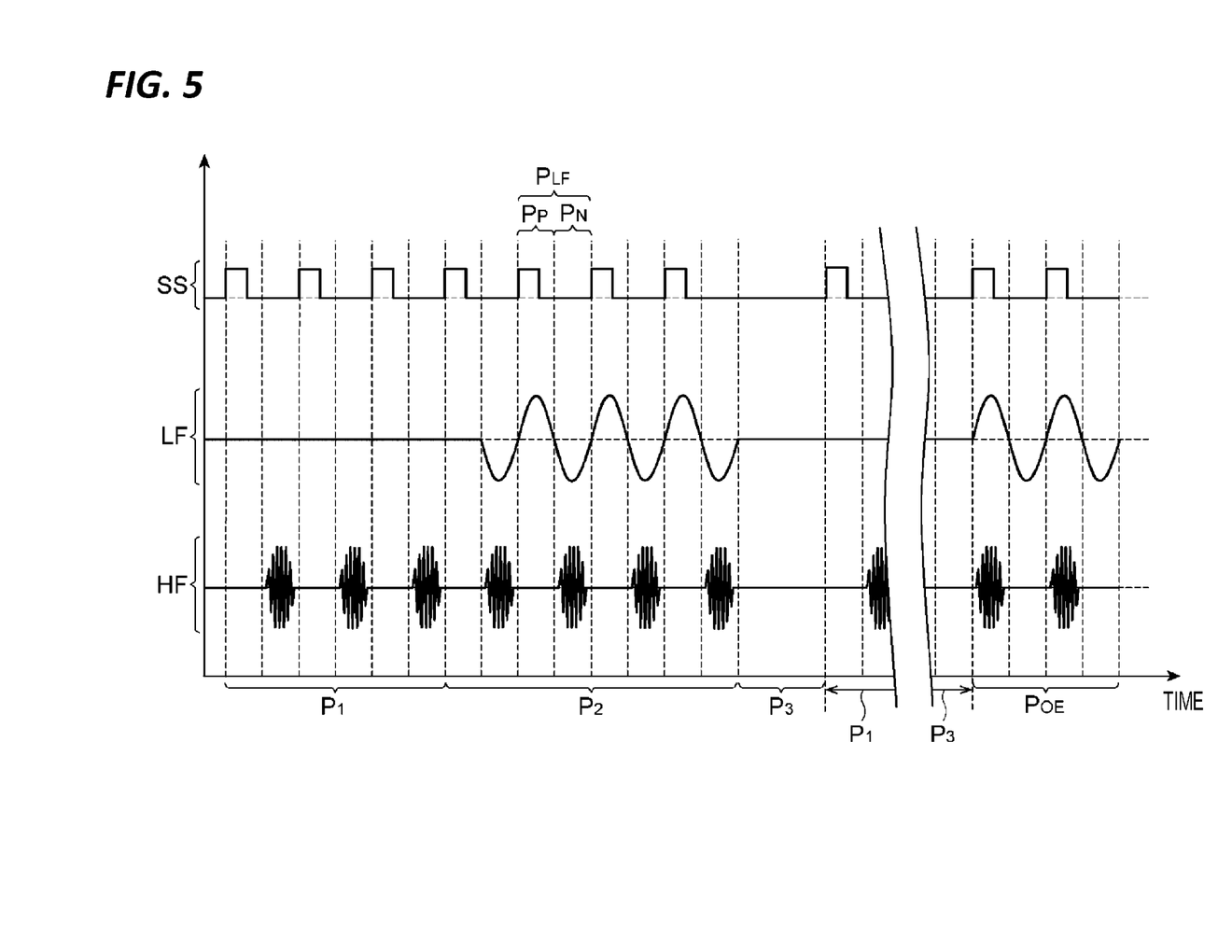
FIG. 5 is a timing chart of another example according to the plasma processing method illustrated in FIG. 1.
Figure 6:
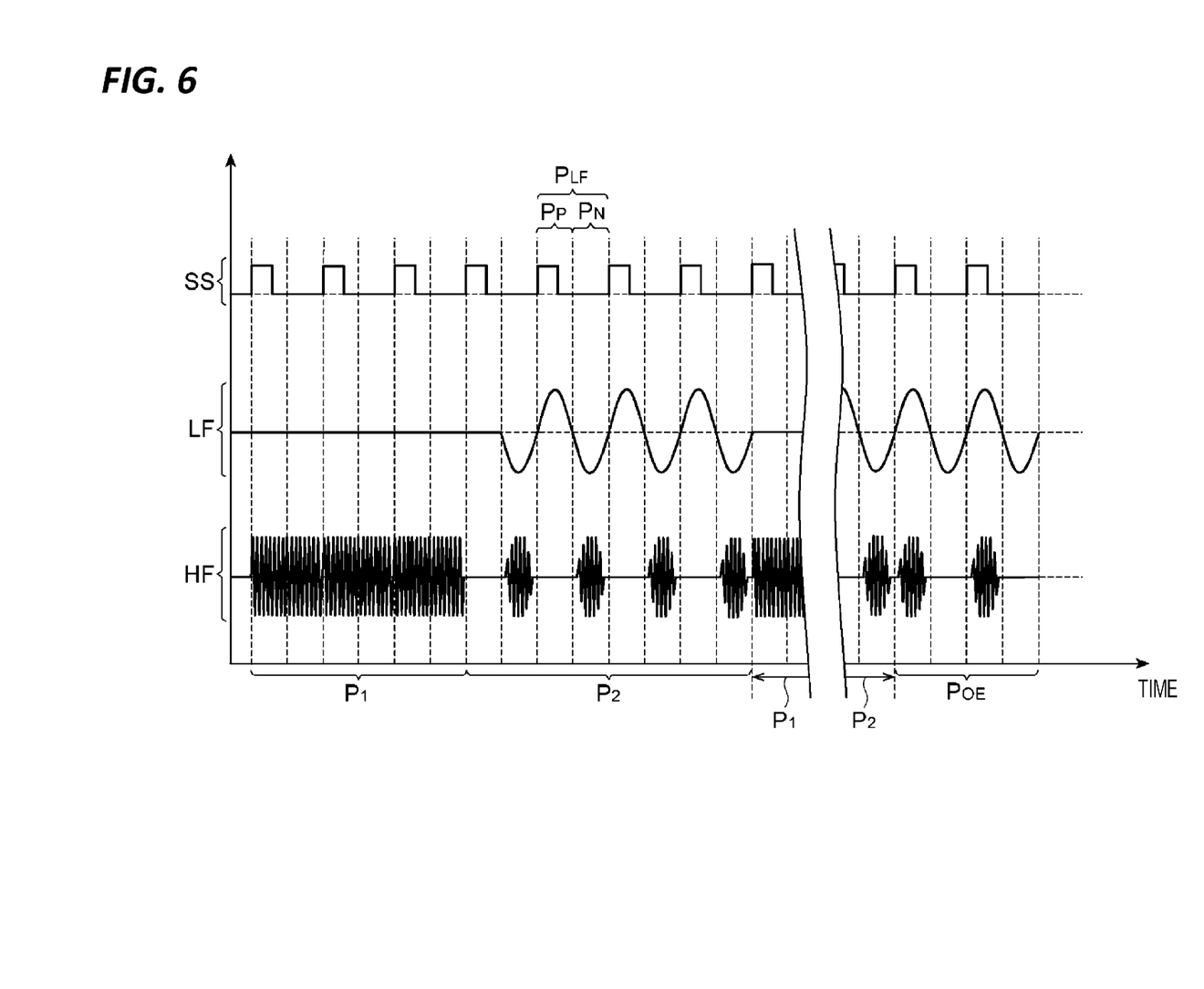
FIG. 6 is a timing chart of yet another example according to the plasma processing method illustrated in FIG. 1.

In the example illustrated in FIG. 4 and in the example illustrated in FIG. 5, the second radio-frequency power HF is supplied to the lower electrode 18 (or upper electrode 30) as a pulsed radio-frequency power in the first period $P_1$ in which step ST1 is performed. In the embodiment, the second radio-frequency power HF may be supplied as a pulsed radio-frequency power in the first period $P_1$, in the same cycle as the cycle in which the second radio-frequency power HF is supplied as a pulsed radio-frequency power within the second period $P_2$. In the example illustrated in FIG. 6 and in the example illustrated in FIG. 7, the second radio-frequency power HF is continuously supplied to the lower electrode 18 (or upper electrode 30) in the first period P1 in which step ST1 is performed. The second radio-frequency power supply 62 is controlled by the controller 80 to supply the second radio-frequency power HF in the first period $P_1$.

In step ST2, a processing gas (hereinafter, may be referred to as a "second processing gas") is supplied into the chamber 10. The second processing gas may contain a fluorocarbon gas such as $C_4F_8$ gas. The second processing gas may further contain an oxygen-containing gas such as $O_2$ gas and/or a rare gas such as argon gas. That is, the second processing gas may be the same as the first processing gas, and may be different from the first processing gas.

In step ST2, the gas supply GS is controlled by the controller 80 to supply the processing gas. In step ST2, the exhaust device 50 is controlled by the controller 80 to set the pressure in the chamber 10 to a designated pressure. The pressure in the chamber 10 is set to a pressure, for example, in a range of several mTorr to 1,000 mTorr.

In the second period $P_2$ in which step ST2 is performed, the first radio-frequency power LF is continuously supplied to the lower electrode 18. In the second period $P_2$ in which step ST2 is performed, the first radio-frequency power supply 61 is controlled by the controller 80 to continuously supply the first radio-frequency power LF to the lower electrode 18.

In the examples illustrated in each of FIGS. 4 to 7, the second radio-frequency power HF is supplied to the lower electrode 18 (or upper electrode 30) as a pulsed radio-frequency power in each period $P_{LF}$ of the first radio-frequency power LF within the second period $P_2$. The second radio-frequency power supply 62 is controlled by the controller 80 to supply the second radio-frequency power HF in the second period $P_2$.

The period in which the second radio-frequency power HF is supplied as a pulsed radio-frequency power is a partial period in each period $P_{LF}$ within the second period $P_2$. The partial period in which the second radio-frequency power HF is supplied as a pulsed radio-frequency power may be set arbitrarily. Each period $P_{LF}$ includes a negative voltage output period $P_N$ and a positive voltage output period $P_N$. The negative voltage output period $P_N$ is a period in which the first radio-frequency LF output from the first radio-frequency power supply 61 has a negative potential. The positive voltage output period $P_P$ is a period in which the first radio-frequency LF output from the first radio-frequency power supply 61 has a positive potential. In the examples illustrated in each of FIGS. 4 to 7, the second radio-frequency power HF is supplied as a pulsed radio-frequency power in the negative voltage output period $P_N$ in each period $P_{LF}$ within the second period $P_2$.

The second radio-frequency power supply 62 is configured to supply a pulsed radio-frequency power at a timing designated by the controller 80 in each period $P_{LF}$ specified by the synchronization signal SS. Therefore, the second radio-frequency power HF may be supplied as a pulsed radio-frequency power with the same phase relative to the cycle of the first radio-frequency power LF.

In step ST1, plasma is formed from the first processing gas in the chamber 10. In step ST1, the first radio-frequency power LF is not supplied to the lower electrode 18. Therefore, as illustrated in FIG. 3B, chemical species generated from the first processing gas in the chamber 10 is deposited on the substrate W to form a deposit DPA.

In step ST2, since the first radio-frequency power LF is supplied to the lower electrode 18, the film FA1 and the film FA2 of the substrate W are etched by ions generated from the second processing gas in the chamber 10. Further, in step ST2, the second radio-frequency power HF is supplied as a pulsed radio-frequency power in each period $P_{LF}$. A period in which the second radio-frequency power HF is supplied as a pulsed radio-frequency power in each period $P_{LF}$ is set, whereby the energy of the ions used for etching may be set.

In the examples illustrated in each of FIGS. 4 to 7, as described above, the second radio-frequency power HF is supplied as a pulsed radio-frequency power in the negative voltage output period $P_N$ in each period $P_{LF}$ within the second period $P_2$. Therefore, a voltage peak value Vpp of the substrate on the support stage 14 is increased, and the energy of the ions directed from the plasma toward the substrate W is relatively increased. Therefore, the film of the substrate W is etched at a high speed.

In step STJ, it is determined whether a stop condition is satisfied or not. That is, in step STJ, it is determined whether to stop the sequence SQ including step ST1 and step ST2. The stop condition is satisfied, for example, when it is determined that the light emission intensity of CO acquired by the light emission analyzer 54 is a predetermined value or less. Alternatively, the stop condition is satisfied when the number of performance of the sequence has reached a predetermined number. In step STJ, the sequence SQ is performed again when it is determined that the stop condition is not satisfied. Meanwhile, when it is determined that the stop condition is satisfied in step STJ, the performance of the sequence SQ is terminated. By repeating the sequence SQ, the film FA1 and the film FA2 are etched. As a result, as illustrated in FIG. 3C, an opening continuous with the opening of the mask MKA is formed in the film FA1 and the film FA2, and the underlying region URA is exposed.

Figure 7:
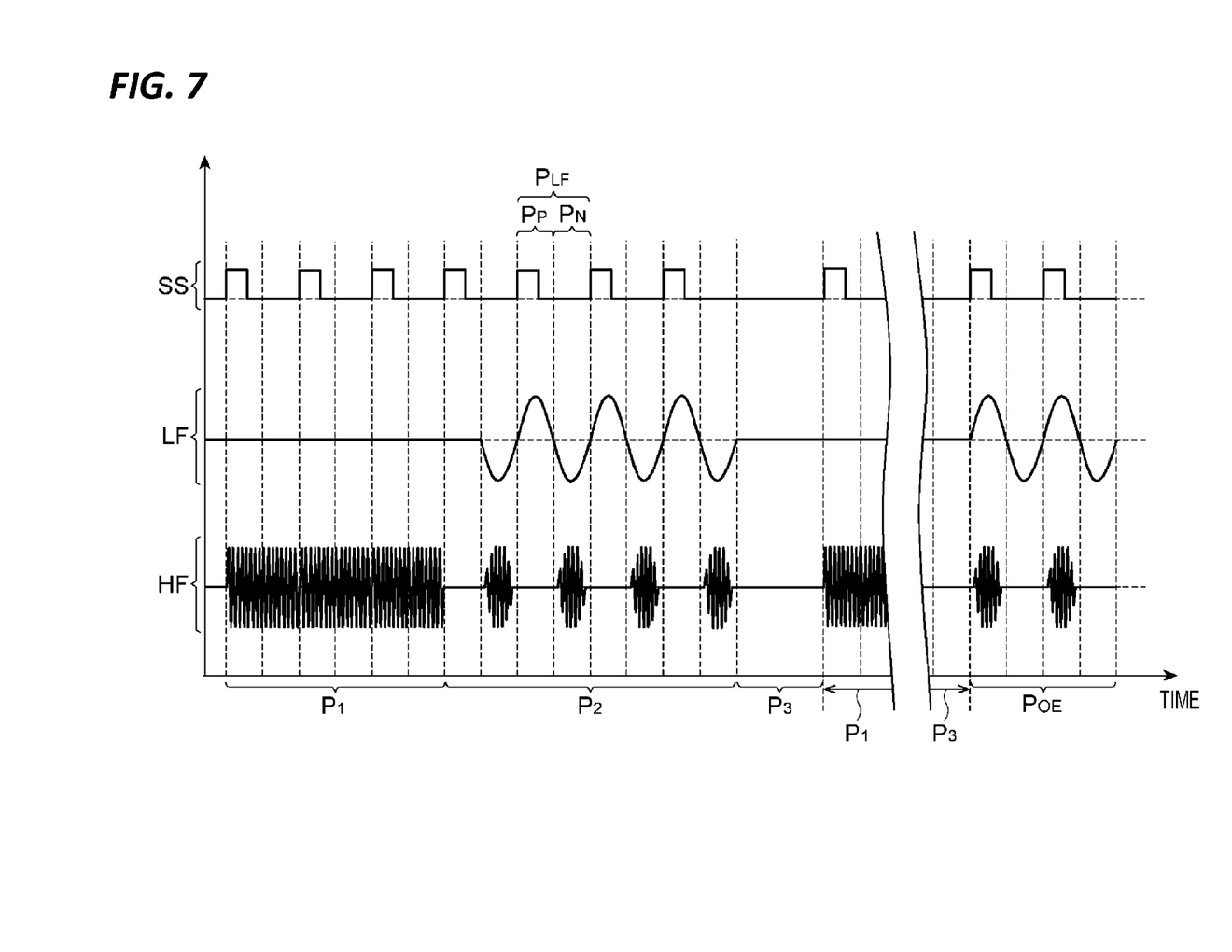
FIG. 7 is a timing chart of yet another example according to the plasma processing method illustrated in FIG. 1.

In the embodiment, the method MT may further include step ST3. Step ST3 is performed after step ST2 in the sequence SQ. That is, as illustrated in FIGS. 5 and 7, step ST3 is performed in a third period $P_3$ after the second period $P_2$. In step ST3, the chamber 10 is exhausted in a state where the supply of the first radio-frequency power LF and the second radio-frequency power HF is stopped. In step ST3, the controller 80 controls the first radio-frequency power supply 61 and the second radio-frequency power supply 62 to stop the supply of the first radio-frequency power LF and the second radio-frequency power HF, and controls the exhaust device 50 to perform the exhaust of the chamber 10. In the sequence SQ, when step ST3 is performed after step ST2, exhaust of the reaction product generated in step ST2 is promoted. As a result, the reaction product is suppressed from being adhered to the side wall surface of the substrate W.

In the embodiment, the method MT may further include step ST4. Step ST4 is performed in a period $P_{OE}$ after terminating the repetition of the sequence SQ. In step ST4, an over etching is performed.

In step ST4, a processing gas is supplied into the chamber 10. The processing gas used in step ST4 may be the same processing gas as the second processing gas. In step ST4, the gas supply GS is controlled by the controller 80 to supply the processing gas. In step ST4, the exhaust device 50 is controlled by the controller 80 to set the pressure in the chamber 10 to a predetermined pressure. The pressure in the chamber 10 is set to a pressure, for example, in a range of several mTorr to 1,000 mTorr.

In the second period $P_{OE}$ in which step ST4 is performed, the first radio-frequency power LF is continuously supplied to the lower electrode 18. In the second period $P_2$ in which step ST2 is performed, the first radio-frequency power supply 61 is controlled by the controller 80 to continuously supply the first radio-frequency power LF to the lower electrode 18.

The second radio-frequency power HF is supplied to the lower electrode 18 (or upper electrode 30) as a pulsed radio-frequency power in each period $P_{LF}$ of the first radio-frequency power LF within the period $P_{OE}$. The second radio-frequency power HF is supplied as a pulsed radio-frequency power in the positive voltage output period $P_P$ in each period $P_{LF}$ within the period $P_{OE}$. The second radio-frequency power supply 62 is controlled by the controller 80 to supply the second radio-frequency power HF in the period $P_{OE}$. In step ST4, the voltage peak value Vpp of the substrate on the support stage 14 is decreased, and the energy of the ions directed from the plasma toward the substrate W is relatively decreased. Therefore, in step ST4, the over etching of the film FA1 and the film FA2 is performed while suppressing the etching of the underlying region URA.

Figure 8A:
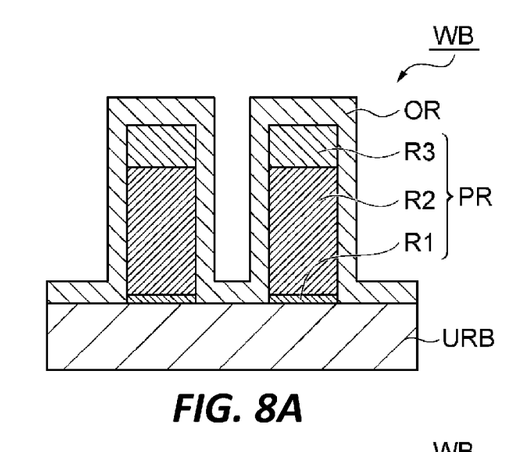
FIG. 8A is a partial cross-sectional view of a substrate of another example to which a method MT illustrated in FIG. 1 may be applied.
Figure 8B:
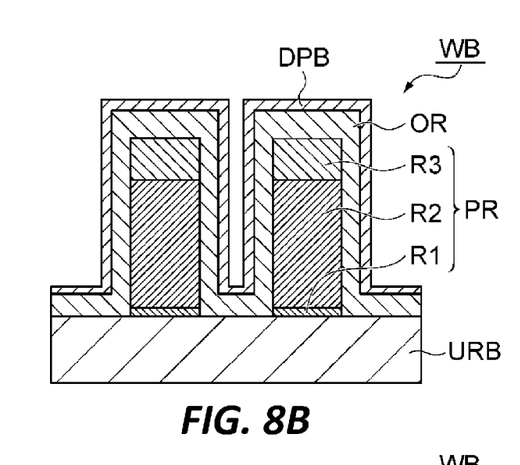
FIG. 8B is a partial cross-sectional view of the substrate of the another example in a state after step ST1 of the method MT is performed.
Figure 8C:
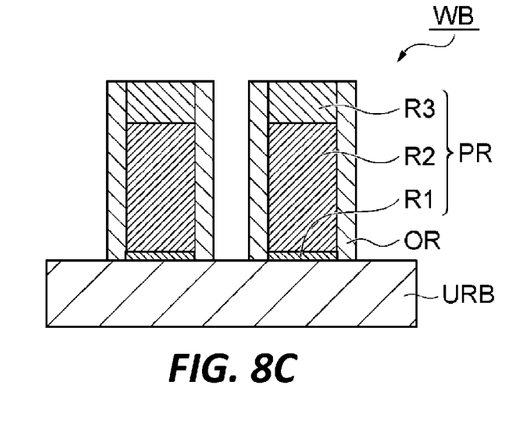
FIG. 8C is a partial cross-sectional view of the substrate of the another example in a state after a sequence SQ of the method MT is performed.
Figure 8D:
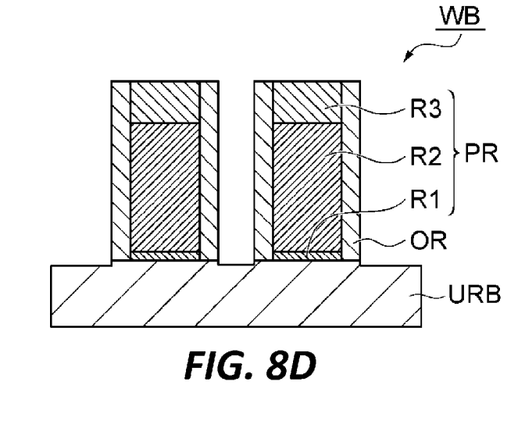
FIG. 8D is a partial cross-sectional view of the substrate of the another example in a state after step ST4 of the method MT is performed.
Figure 9:
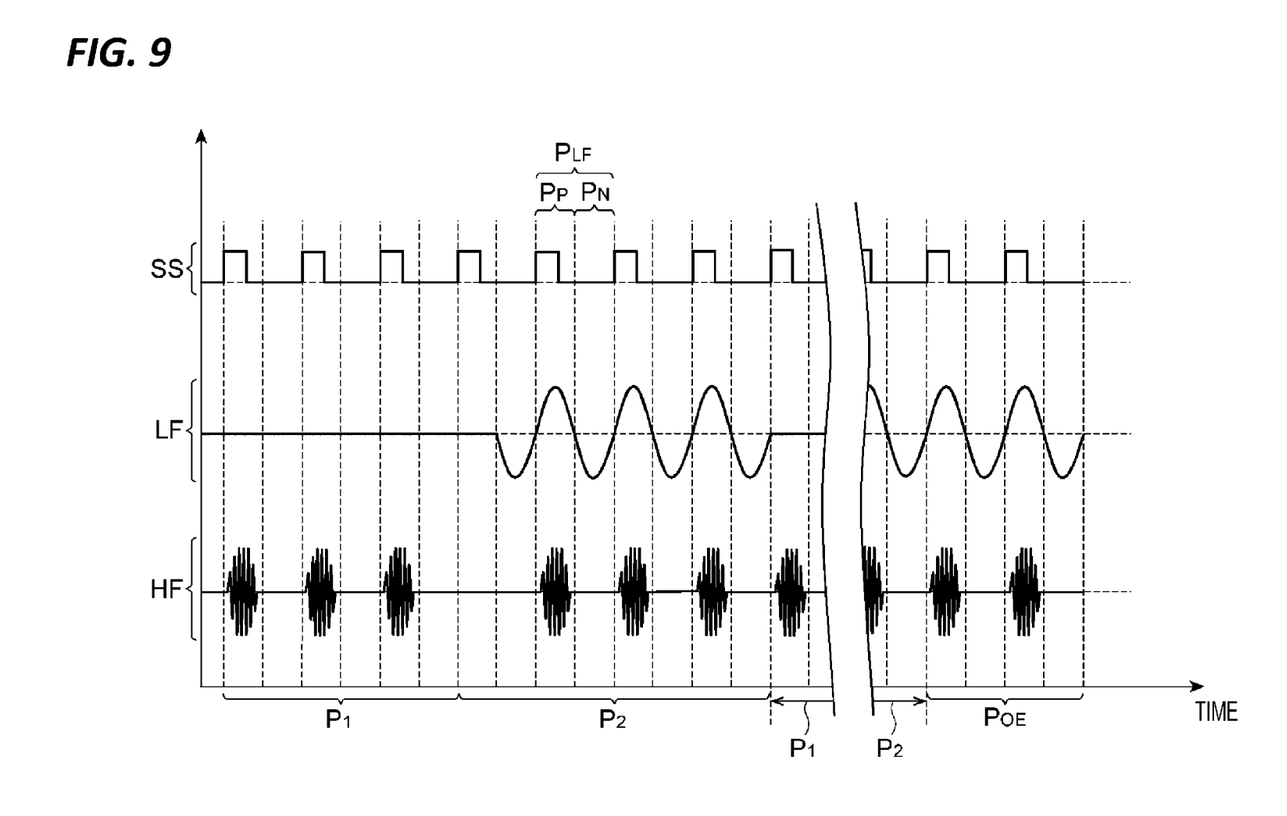
FIG. 9 is a timing chart of another example according to the plasma processing method illustrated in FIG. 1.

In the following, FIGS. 8A to 8D and FIG. 9 are referred to together with FIG. 1. FIG. 8A is a partial cross-sectional view of a substrate of another example to which the method MT illustrated in FIG. 1 may be applied. FIG. 8B is a partial cross-sectional view of the substrate of the another example in a state after performing step ST1 of the method MT, FIG. 8C is a partial cross-sectional view of the substrate of the another example in a state after performing the sequence SQ of the method MT, and FIG. 8D is a partial cross-sectional view of the substrate of the another example in a state after performing step ST4 of the method MT. FIG. 9 is a timing chart of yet another example according to the plasma processing method illustrated in FIG. 1.

As illustrated in FIG. 8A, a substrate WB of the another example to which the method MT may be applied includes an underlying region URB, a raised region PR, and an offset region OR. The underlying region URB is made of, for example, silicon. The raised region PR is provided on the underlying region URB. The raised region PR extends to protrude from the underlying region URB. The raised region PR may have a substantially rectangular parallelepiped shape. The raised region PR includes a first region R1, a second region R2, and a third region R3. The first region R1 extends on the underlying region URB. The first region R1 is, for example, a gate oxide film. The second region R2 extends on the first region R1. The second region R2 is made of, for example, polycrystalline silicon. The third region R3 extends on the second region R2. The third region R3 is made of, for example, silicon nitride. The offset region OR extends along the surface of the raised region PR and the surface of the underlying region URB to cover the raised region PR and the underlying region URB. The offset region OR is made of, for example, silicon oxide. The offset region OR may be a multilayer film including a silicon oxide film and silicon nitride film.

In the case of the example illustrated in FIG. 9, step ST1 in the method MT is the same as step ST1 of the examples illustrated in each of FIGS. 4 to 7. In the case of the example illustrated in FIG. 9, in step ST1 of the method MT, chemical species from the plasma generated in the chamber 10 is deposited on the substrate WB to form a deposit DPB, as illustrated in FIG. 8B.

Unlike step ST2 of the examples illustrated in each of FIGS. 4 to 7, in step ST2 of the example illustrated in FIG. 9, the second radio-frequency power HF is supplied as a pulsed radio-frequency power in the positive voltage output period $P_P$ in each period $P_{LF}$ within the second period $P_2$. In other aspects, step ST2 in the example illustrated in FIG. 9 is the same as step ST2 in the examples illustrated in each of FIGS. 4 to 7.

In the method of the example illustrated in FIG. 9, an anisotropic etching of the substrate WB, that is, an etching in the vertical direction is proceeded by repeating the sequence SQ. As a result, as illustrated in FIG. 8C, the offset region OR is removed on the third region R3 and on the underlying region URB. The sequence SQ may further include step ST3 described above.

Thereafter, step ST4 is performed. In the case of the example illustrated in FIG. 9, step ST4 in the method MT is the same as step ST4 of the examples illustrated in each of FIGS. 4 to 7. As illustrated in FIG. 8D, an over etching of the substrate WB is performed by performing step ST4 of the example illustrated in FIG. 9.

In the sequence SQ of the example illustrated in FIG. 9, the anisotropic etching of the substrate WB is proceeded while protecting the offset region OR by the deposit DPB in the portion along the side surface of the raised region PR. Therefore, the width of the offset region OR is suppressed from being narrowed at the portion along the side surface of the raised region PR. Further, in step ST2 of the example illustrated in FIG. 9, the voltage peak value Vpp of the substrate on the support stage 14 is decreased, and the energy of the ions directed from the plasma toward the substrate W is relatively decreased. Therefore, the etching of the third region R3 and the underlying region URB is suppressed.

Although various exemplary embodiments have been described above, the present disclosure is not limited to the exemplary embodiments described above, and various omissions, substitutions, and modifications may be made. Further, it is possible to combine the elements in different embodiments to form other embodiments.

For example, the plasma processing method according to various embodiments may be performed using an inductively coupled plasma processing apparatus. In the inductively coupled plasma processing apparatus, the second radio-frequency power is supplied to an antenna to form an induction magnetic field in the chamber 10.

According to an exemplary embodiment, it is possible to set the energy of ions used for etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
providing a substrate disposed on a substrate support stage including a lower electrode in a plasma processing chamber in which the substrate is processed using a first radio frequency (RF) power having a first frequency and a second RF power having a second frequency higher than the first frequency;
(a) performing a first plasma process in a first period, the first plasma process comprising:
supplying a continuous or pulsed form of the second RF power without supplying the first RF power;
(b) performing a second plasma process in a second period different from the first period, the second period including a plurality of cycles, each cycle including a first cycle period and a second cycle period different from the first cycle period, the second plasma process comprising:
supplying the first RF power to the lower electrode in each cycle;
supplying the second RF power in the first cycle period; and
stopping the second RF power in the second cycle period such that the second RF power is not supplied throughout the second cycle period; and
(c) repeating (a) and (b),
wherein the first RF power has a substantially same frequency in the first cycle period and the second cycle period.

2. The method according to claim 1, wherein the first RF power has a negative potential in the first cycle period.

3. The method according to claim 1, wherein the first RF power has a positive potential in the first cycle period.

4. The method according to claim 1, wherein the first plasma process and the second plasma process are performed with an identical process gas.

5. The method according to claim 1, wherein the first RF power in the first cycle period has a polarity different from a polarity of the first RF power in the second cycle period.

6. The method according to claim 1, wherein the second RF power is supplied to the lower electrode or to an upper electrode provided above the substrate support stage.

7. A plasma processing method comprising:
providing a substrate disposed on a substrate support stage including a lower electrode in a plasma processing chamber in which the substrate is processed using a first radio frequency (RF) power having a first frequency and a second RF power having a second frequency higher than the first frequency;
(a) performing a first plasma process in a first period, the first plasma process comprising:
supplying a continuous or pulsed form of the second RF power without supplying the first RF power;
(b) performing a second plasma process in a second period different from the first period, the second period including a plurality of cycles, each cycle including a first cycle period and a second cycle period different from the first cycle period, the second plasma process comprising:
supplying the first RF power to the lower electrode in each cycle;
supplying the second RF power in the first cycle period; and
stopping the second RF power in the second cycle period such that the second RF power is not supplied throughout the second cycle period; and
(c) repeating (a) and (b),
wherein the pulsed form of the second RF power is supplied in the second period, and the pulsed form of the second RF power has an identical cycle in the first period and the second period.

8. A plasma processing method comprising:
providing a substrate disposed on a substrate support stage including a lower electrode in a plasma processing chamber in which the substrate is processed using a first radio frequency (RF) power having a first frequency and a second RF power having a second frequency higher than the first frequency;
(a) performing a first plasma process in a first period, the first plasma process comprising:
supplying a continuous or pulsed form of the second RF power without supplying the first RF power;
(b) performing a second plasma process in a second period different from the first period, the second period including a plurality of cycles, each cycle including a first cycle period and a second cycle period different from the first cycle period, the second plasma process comprising:
supplying the first RF power to the lower electrode in each cycle;
supplying the second RF power in the first cycle period; and
stopping the second RF power in the second cycle period such that the second RF power is not supplied throughout the second cycle period;
(c) stopping the first RF power and the second RF power and then evacuating gases in the plasma processing chamber after (a) and (b); and
(d) repeating (a), (b) and (c).

9. (Withdrawn- Previously Presented) The method according to claim 8, wherein the first plasma process and the second plasma process are performed with different process gases.

10. A plasma processing method comprising:
providing a substrate disposed on a substrate support stage including a lower electrode in a plasma processing chamber in which the substrate is processed using a first radio frequency (RF) power having a first frequency and a second RF power having a second frequency higher than the first frequency;
(a) performing a first plasma process in a first period, the first plasma process comprising:
supplying a continuous or pulsed form of the second RF power without supplying the first RF power; and
(b) performing a second plasma process in a second period different from the first period, the second period including a plurality of cycles, each cycle including a first cycle period and a second cycle period different from the first cycle period, the second plasma process comprising:
supplying the first RF power to the lower electrode in each cycle;
supplying the second RF power in the first cycle period; and
stopping the second RF power in the second cycle period such that the second RF power is not supplied throughout the second cycle period; and
(c) repeating (a) and (b),
wherein the first RF power has a negative potential in the first cycle period, and
wherein the pulsed form of the second RF power has an identical cycle in the first period and the second period.

11. The method according to claim 10, further comprising:
(d) stopping the first RF power and the second RF power and then evacuating the chamber after (a) and (b),
wherein (c) repeats (a), (b) and (d).

12. The method according to claim 11, wherein the first plasma process and the second plasma process are performed with an identical process gas.

13. The method according to claim 11, wherein the first plasma process and the second plasma process are performed with different gases.

14. A plasma processing method comprising:
providing a substrate disposed on a substrate support stage including a lower electrode in a plasma processing chamber in which the substrate is processed using a first radio frequency (RF) power having a first frequency and a second RF power having a second frequency higher than the first frequency;
(a) performing a first plasma process in a first period, the first plasma process comprising:
supplying a continuous or pulsed form of the second RF power without supplying the first RF power;
(b) performing a second plasma process in a second period different from the first period, the second period including a plurality of cycles, each cycle including a first cycle period and a second cycle period different from the first cycle period, the second plasma process comprising:
supplying the first RF power to the lower electrode in each cycle;
supplying the second RF power in the first cycle period; and
stopping the second RF power in the second cycle period such that the second RF power is not supplied throughout the second cycle period;
(c) stopping the first RF power and the second RF power and then evacuating the chamber after (a) and (b); and
(d) repeating (a), (b) and (c),
wherein the first RF power has a positive potential in the first cycle period.

15. The method according to claim 14, wherein the first plasma process and the second plasma process are performed with an identical gas.

16. The method according to claim 14, wherein the first plasma process and the second plasma process are performed with different gas.

17. A plasma processing apparatus comprising:
a plasma processing chamber;

a substrate support stage disposed in the plasma processing chamber;
a lower electrode disposed in the substrate support stage;
a first radio frequency (RF) power supply configured to supply a first RF power to generate a plasma in the plasma processing chamber, the first RF power having a first frequency;
a second RF power supply configured to supply a second RF power to the lower electrode, the second RF power having a second frequency lower than the first frequency; and
a controller configured to control the first RF power supply and the second RF power supply to:
(a) perform a first plasma process in a first period;
(b) perform a second plasma process in a second period different from the first period, the second period including a plurality of cycles, each cycle including a first cycle period and a second cycle period different from the first cycle period; and
(c) repeat (a) and (b),
wherein the first plasma process includes:
supplying a continuous or pulsed form of the first RF power,
wherein the second plasma process includes:
supplying the second RF power to the lower electrode in each cycle;
supplying the first RF power in the first cycle period; and
continuing to stop a supply of the first RF power in the second cycle period, and
wherein the first RF power is supplied in a pulsed form in the second period.

18. The plasma processing apparatus according to claim 17, wherein the second RF power has a negative potential in the first cycle period.

19. The plasma processing apparatus according to claim 18, wherein the controller is further configured to:
(d) stop the first RF power and the second RF power and then evacuate gases in the chamber after (a) and (b), and
(c) repeat (a), (b) and (d).

20. The plasma processing apparatus according to claim 17, wherein the second RF power has a positive potential in the first cycle period.

21. The plasma processing apparatus according to claim 17, wherein the first plasma process and the second plasma process are performed with an identical process gas.

22. The plasma processing apparatus according to claim 17, wherein the second RF power in the first cycle period has a polarity different from a polarity of the second RF power in the second cycle period.

23. A plasma processing apparatus comprising:
a plasma processing chamber;
a substrate support stage disposed in the plasma processing chamber;
a lower electrode disposed in the substrate support stage;
a first radio frequency (RF) power supply configured to supply a first RF power to generate a plasma in the plasma processing chamber, the first RF power having a first frequency;
a second RF power supply configured to supply a second RF power to the lower electrode, the second RF power having a second frequency lower than the first frequency; and
a controller configured to control the first RF power supply and the second RF power supply to:
(a) perform a first plasma process in a first period;
(b) perform a second plasma process in a second period different from the first period, the second period including a plurality of cycles, each cycle including a first cycle period and a second cycle period different from the first cycle period; and
(c) repeat (a) and (b),
wherein the first plasma process includes:
supplying a continuous or pulsed form of the first RF power,
wherein the second plasma process includes:
supplying the second RF power to the lower electrode in each cycle;
supplying the first RF power in the first cycle period; and
continuing to stop a supply of the first RF power in the second cycle period, and
wherein the controller is further configured to:
(d) stop the first RF power and the second RF power and then evacuate gases in the chamber after (a) and (b), and
(e) repeat (a), (b) and (d).

24. A plasma processing apparatus comprising:
a plasma processing chamber;
a substrate support stage disposed in the plasma processing chamber;
a lower electrode disposed in the substrate support stage;
a first radio frequency (RF) power supply configured to supply a first RF power to generate a plasma in the plasma processing chamber, the first RF power having a first frequency;
a second RF power supply configured to supply a second RF power to the lower electrode, the second RF power having a second frequency lower than the first frequency; and
a controller configured to control the first RF power supply and the second RF power supply to:
(a) perform a first plasma process in a first period;
(b) perform a second plasma process in a second period different from the first period, the second period including a plurality of cycles, each cycle including a first cycle period and a second cycle period different from the first cycle period; and
(c) repeat (a) and (b),
wherein the first plasma process includes:
supplying a continuous or pulsed form of the first RF power,
wherein the second plasma process includes:
supplying the second RF power to the lower electrode in each cycle;
supplying the first RF power in the first cycle period; and
continuing to stop a supply of the first RF power in the second cycle period, and
wherein the second RF power has a substantially same frequency in the first cycle period and the second cycle period.

25. A plasma processing apparatus comprising:
a plasma processing chamber;
a substrate support stage disposed in the plasma processing chamber;
a lower electrode disposed in the substrate support stage;
a first radio frequency (RF) power supply configured to supply a first RF power to generate a plasma in the plasma processing chamber, the first RF power having a first frequency;

a second RF power supply configured to supply a second RF power to the lower electrode, the second RF power having a second frequency lower than the first frequency; and a controller configured to control the first RF power supply and the second RF power supply to:
(a) perform a first plasma process in a first period;
(b) perform a second plasma process in a second period different from the first period, the second period including a plurality of cycles, each cycle including a first cycle period and a second cycle period different from the first cycle period; and
(c) repeat (a) and (b), wherein the first plasma process includes:
supplying a continuous or pulsed form of the first RF power, wherein the second plasma process includes:
supplying the second RF power to the lower electrode in each cycle;
supplying the first RF power in the first cycle period; and
continuing to stop a supply of the first RF power in the second cycle period, and wherein the pulsed form of the first RF power is supplied in the second period, and the pulsed form of the first RF power has an identical cycle in the first period and the second period.

26. A plasma processing apparatus comprising:
a plasma processing chamber;
a substrate support stage disposed in the plasma processing chamber;
a lower electrode disposed in the substrate support stage;
a first radio frequency (RF) power supply configured to supply a first RF power to generate a plasma in the plasma processing chamber, the first RF power having a first frequency;
a second RF power supply configured to supply a second RF power to the lower electrode, the second RF power having a second frequency lower than the first frequency; and
a controller configured to control the first RF power supply and the second RF power supply to:
(a) perform a first plasma process in a first period;
(b) perform a second plasma process in a second period different from the first period, the second period including a plurality of cycles, each cycle including a first cycle period and a second cycle period different from the first cycle period; and
(c) repeat (a) and (b), wherein the first plasma process includes:
supplying a continuous or pulsed form of the first RF power, wherein the second plasma process includes:
supplying the second RF power to the lower electrode in each cycle;
supplying the first RF power in the first cycle period; and
continuing to stop a supply of the first RF power in the second cycle period, wherein the second RF power has a negative potential in the first cycle period, and wherein the pulsed form of the first RF power has an identical cycle in the first period and the second period.

* * * * *